United States Patent [19]

Hallford

[11] 4,375,699

[45] Mar. 1, 1983

[54] MICROWAVE FREQUENCY CONVERTER WITH DUAL BALUN PORT

[75] Inventor: Ben R. Hallford, Wylie, Tex.

[73] Assignee: Rockwell International Corporation, El Segundo, Calif.

[21] Appl. No.: 243,662

[22] Filed: Mar. 13, 1981

[51] Int. Cl.$^3$ .............................................. H04B 1/26
[52] U.S. Cl. ...................................... 455/327; 333/26
[58] Field of Search ................................. 333/25, 26; 455/325–327, 330, 331

[56] References Cited

U.S. PATENT DOCUMENTS 3,678,433  7/1972  Hallford
3,831,097  8/1974  Neuf
4,186,352  1/1980  Hallford .......................... 455/327

OTHER PUBLICATIONS

Matthaei, et al., "Microwave Filters, Impedance-Matching Networks, and Coupling Structures", 1964, McGraw-Hill, New York, pp. 809–812.

Primary Examiner—Marc E. Bookbinder
Attorney, Agent, or Firm—Michael E. Taken; Bruce C. Lutz; Howard R. Greenberg

[57] ABSTRACT

A microwave frequency converter is provided with a diode mixer bridge having a balanced port connected to a dual balun. The dual balun is provided by two pairs of balanced secondary conductors juxtaposed a common primary conductor, each pair contributing to the field between balanced conductors leading to the mixer bridge. The dual balun and microstrip circuit layout enable a wider gap to be used between the balanced conductors to the bridge, which enables manufacturably cost efficient implementation.

4 Claims, 8 Drawing Figures

MICROWAVE FREQUENCY CONVERTER WITH DUAL BALUN PORT

TECHNICAL FIELD

The invention relates to microwave diode mixers and associated circuitry for up and down conversion between high frequency signals (e.g., RF or LO in the 6 GHz range) and low frequency signals (e.g., IF in the 70 MHz range), and more particularly to a dual balun structure enabling a wider coupling gap between balanced conductors supplying a balanced port for a diode mixer bridge.

BACKGROUND AND SUMMARY

The present invention evolved from continuing development efforts pertaining to subject matter disclosed in my co-pending Application Ser. No. 216,872, filed Dec. 15, 1980 entitled "Balun Coupled Microwave Frequency Converter" now issued as U.S. Pat. No. 4,330,868, on May 18, 1982. This patent discloses a diode mixer bridge with a balanced port and an unbalanced port.

The present invention relates to improvements in the microstrip circuit layout and structure for the balanced port. The invention enables a wider coupling gap between the balanced conductors providing the balanced port for the diode mixer bridge. This wider coupling gap is easier to implement and reduces manufacturing cost. The invention has widespread application to various types of mixers having a balanced port.

DETAILED DESCRIPTION

Figure 1:
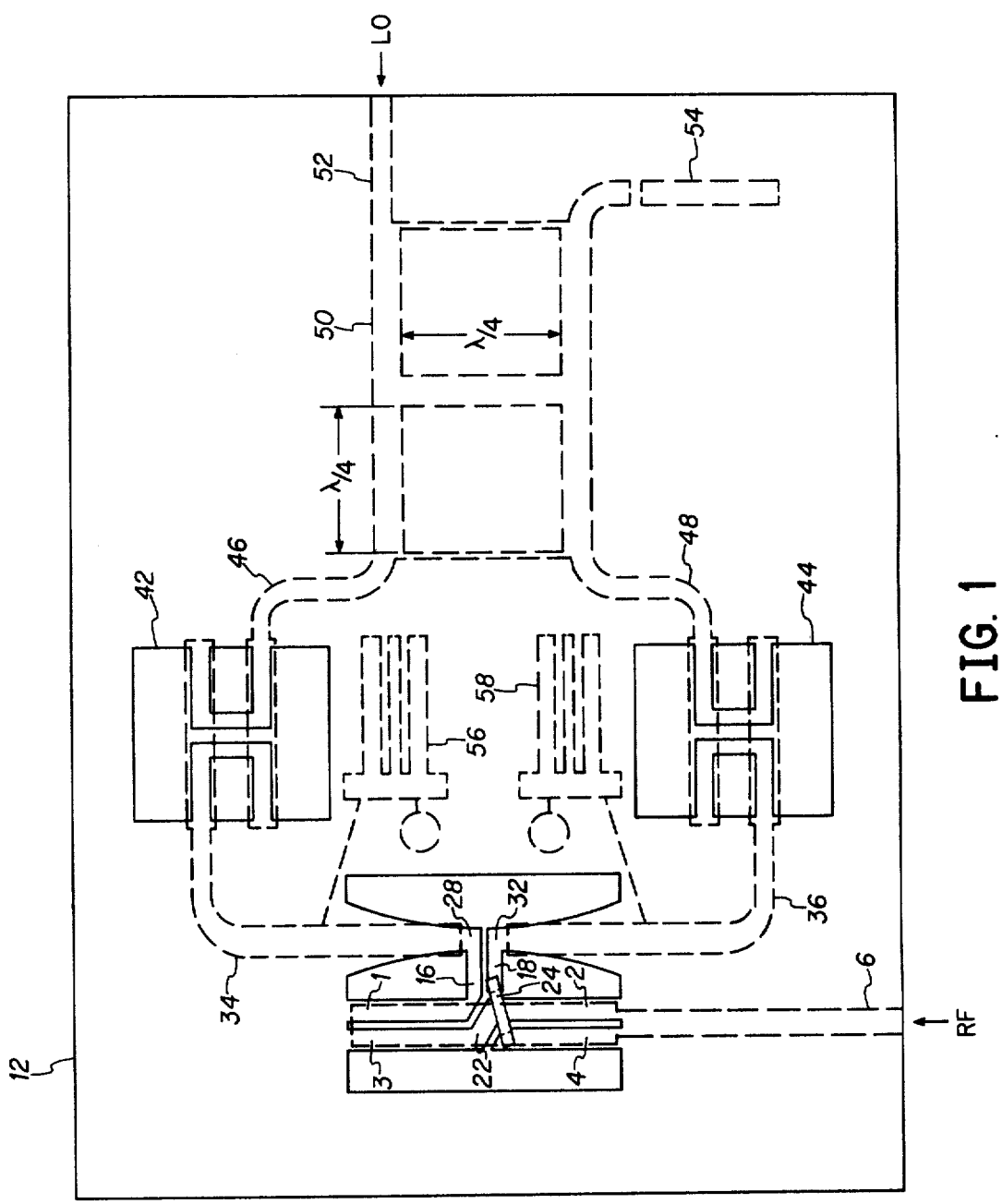
FIG. 1 is a top plan view of the microstrip circuit layout of a frequency converter constructed in accordance with the invention.
Figure 2:
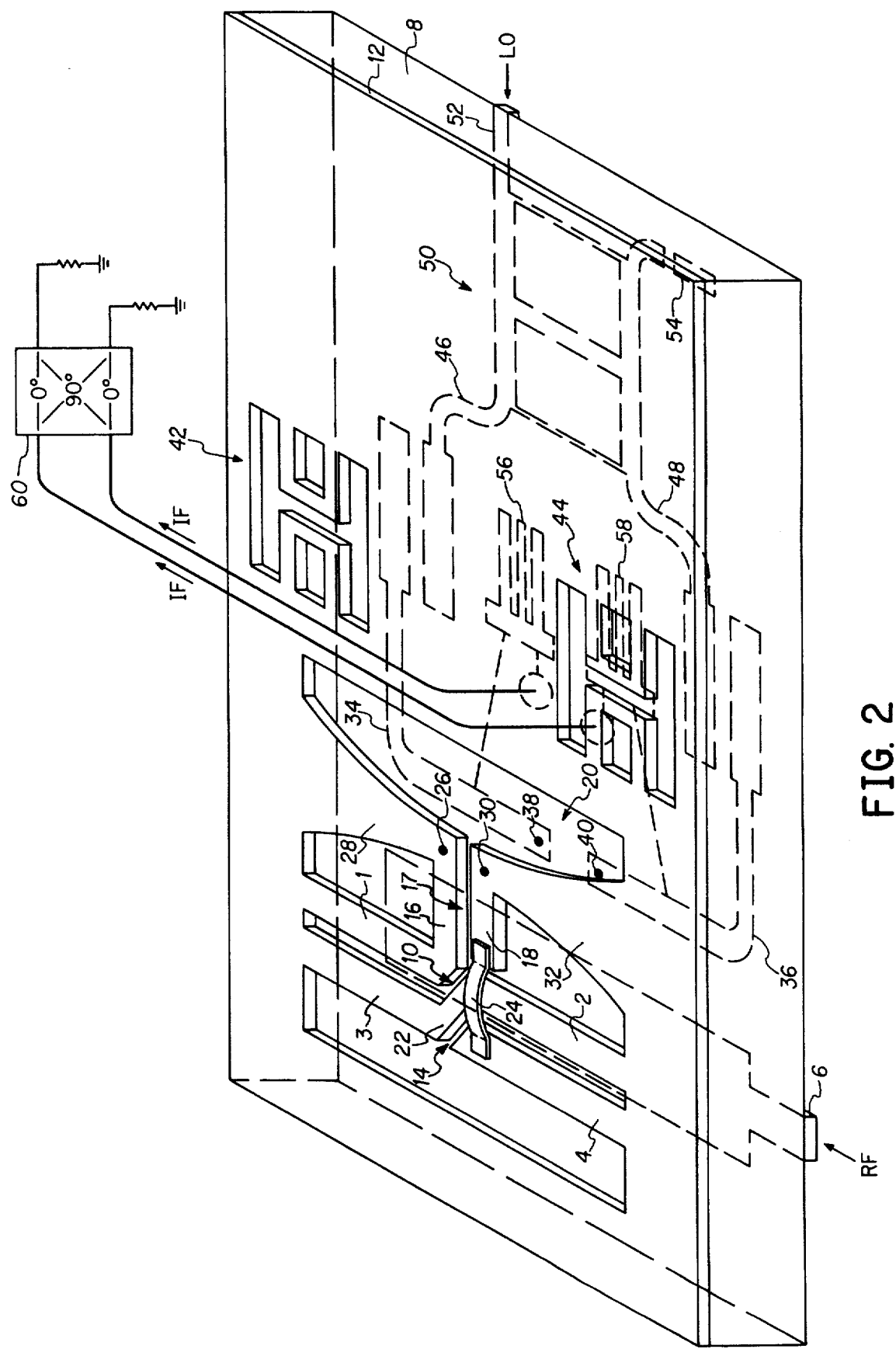
FIG. 2 is a pictorial illustration of the microstrip circuit layout and structure of the frequency converter of FIG. 1.

FIGS. 1 and 2 show a frequency converter having a dual balun provided by two parts of balanced secondary conductors 1 and 2, and 3 and 4, juxtaposed a common primary conductor 6. Primary conductor 6 is on the bottom side of a dielectric substrate 8 and carries an RF signal which is coupled to the first pair of balanced secondary conductors 1 and 2 on the top side of substrate 8, and to the second pair of balanced secondary conductors 3 and 4 on the top side of substrate 8.

The first pair of secondary conductors comprises first and second secondary conductors 1 and 2 collinearly extending toward each other and separated by a gap 10. Conductors 1 and 2 extend from a ground plane 12 on the top side of substrate 8. The other pair of secondary conductors comprises third and fourth secondary conductors 3 and 4 collinearly extending toward each other from ground plane 12 and separated by a gap 14. The first and third secondary conductors 1 and 3 extend in spaced parallel relation. The second and fourth secondary conductors 2 and 4 likewise extend in spaced parallel relation.

Figure 3:
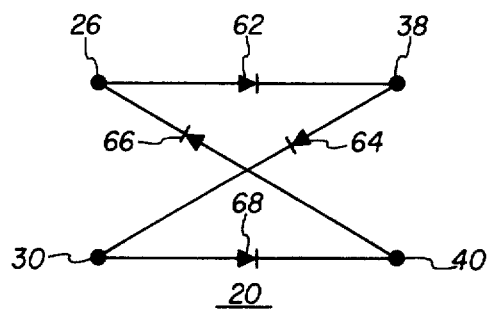
FIG. 3 shows the diode bridge connection for FIG. 2.

A pair of balanced conductors 16 and 18 on the top side of substrate 8 lead from the dual balun provided by secondary conductors 1, 2, 3 and 4 to a diode mixer bridge 20, FIG. 3, for heterodyne modulation product signal generation. The connection of mixer bridge 20 is described hereinafter. Balanced conductor 16 leads to bridge 20 from the first secondary conductor 1. The other balanced conductor 18 leads to bridge 20 from the fourth secondary conductor 4. The second and third secondary conductors 2 and 3 are integrally connected to each other by a conductive portion 22 extending diagonally between the proximate ends thereof. Conductors 4 and 18 are connected by a jumper 24 over and separated from diagonal portion 22.

Each pair of balanced secondary conductors of the dual balun contribute to the field between balanced conductors 16 and 18 leading to the diode bridge. Conductors 2 and 3 are ohmically connected and at the same potential, such that the field between conductors 1 and 2 contributes half of the field between conductor 16 and 18, and the field between conductors 3 and 4 contribute the other half of the field between conductors 16 and 18.

The end of conductor 16 has a diode connection point 26 from which a wide flared sub 28 extends to ground plane 12. The end of conductor 18 has a diode connection point 30 from which a wide flared stub 32 extends to ground plane 12. Unbalanced, coplanar LO/IF conductors 34 and 36 are on the bottom side of substrate 8 and extend toward each other and the common area adjacently below topside conductor points 26 and 30. The ends of LO/IF conductors 34 and 36 are spaced and have diode connection points 38 and 40 for diode interconnection with connection points 26 and 30, as shown in FIG. 3. RF conductors 16 and 18 are on the top side of the substrate, and the LO/IF conductors 34 and 36 are on the bottom side of the substrate. Ohmic leads extend from points 26 and 30 down through the substrate, and the diode bridge is connected on the bottom side of the substrate.

Microstrip LO/IF conductors 34 and 36 on the bottom of substrate 8 each leads to an area juxtaposed a respective balun IF rejection filter 42 and 44 etched on ground plane 12 thereabove for balun coupling therewith. Each balun IF rejection filter 42 and 44 is provided by the filter described in my U.S. Pat. No. 4,240,052, issued Dec. 16, 1980 entitled "Balun Filter Apparatus". Coplanar, unbalanced microstrip LO conductors 46 and 48 are on the bottom of substrate 8, each leading from the area juxtaposed a respective one of the balun IF rejection filters 42 and 44 for balun coupling therewith. IF signals generated by the diode mixer bridge on LO/IF conductors 34 and 36 are isolated from LO conductors 46 and 48 by balun IF rejection filters 42 and 44.

A microstrip branch line coupler 50, for example as described in George L. Matthaei, et al., "Microwave Filters, Impedance-Matching Networks, and Coupling Structures", 1964, New York, McGraw-Hill, pp. 809-812, is on the bottom side of substrate 8 and is connected to conductors 46 and 48. This microstrip branchline coupler has quarter wavelength segments as shown, and yields quadrature microstrip outputs 52 and 54.

A pair of IF bandpass filters 56 and 58 are on the bottom side of substrate 8 and are connected to LO/IF conductors 34 and 36. Filters 56 and 58 are RF suppression filters rejecting RF signals but allowing IF signals to pass therethrough, an example of which is described in my U.S. Pat. No. 3,678,433, issued July 18, 1972, entitled "RF Rejection Filter". Filters 56 and 58 are connected to a 90° quadrature hybrid 3 dB coupler 60, an example of which is shown in U.S. Pat. No. 3,831,097 to Neuf.

When implemented as a down converter, an RF signal is input at port 6 and an LO signal is input at port 52. The RF signal is coupled from primary conductor 6 to secondary conductors 1 and 2 and to secondary conductors 3 and 4, which in turn provide the field existing across the gap 17 between balanced conductors 16 and 18. Conductors 16 and 18 thus provide a balanced input port to diode mixer bridge 20 at points 26 and 30, i.e., the RF field exists between balanced points 26 and 30, which points are referenced to each other, not to ground. The LO signals from input 52 are coupled through branch line coupler 50 and through filters 42 and 44 to unbalanced microstrip conductors 34 and 36 leading to points 38 and 40. Points 38 and 40 provide two unbalanced inputs to the diode mixer bridge 20, i.e., the LO field at point 38 is referenced to ground plane 12, not to LO signal point 40. Likewise, the LO signal at point 40 is referenced to ground, not to point 38.

Diode mixer bridge 20 receives the RF and LO signals and outputs a plurality of frequencies, including an IF signal at a frequency which is the difference between the RF and LO signal frequencies. The frequencies which are output from mixer 20 are the modulation products which exist according to the heterodyne principle by which the mixer operates, wherein an RF signal and an LO signal are applied to a nonlinear element such as a diode. The RF and LO signals are thus mixed in the diode quad 20 to generate the various modulated frequencies, including an IF signal on conductors 34 and 36. These IF signals pass through IF bandpass filters 56 and 58 on the bottom side of substrate 8 and are output by coupler 60.

When implemented as an up converter, LO signals are input at port 52 and IF signals are input through coupler port 60 to generate an output RF signal at port 6. In this latter implementation, the RF signal is induced on primary conductor 6 from secondary conductor pairs 1 and 2, and 3 and 4. In other applications, for both up and down converters, the RF and LO signals are transposed.

The present invention enables the use of a relatively wide gap 17 between balanced conductors 16 and 18 due to the dual balun. As a contrasting example, a single balun would be formed by eliminating conductors 3 and 4, diagonal portion 22 and jumper 24, and by connecting conductor 2 directly to conductor 18. In some applications with this single balun, it was desired to employ 40 mil wide conductors 16 and 18 and have a gap 17 therebetween not less than about 6 mils. This arrangement was found to have an impedance of about 80 to 100 ohms, which was undesirable because it did not match existing 50 ohm transmission lines. To reduce the impedance of the balanced port to the diode mixer bridge provided by conductors 16 and 18 to about 50 ohms, it was necessary to reduce the width of gap 17 to about 3 mils. This in turn was not desirable because a 3 mil gap was deemed too narrow to etch within prescribed manufacturing cost considerations. The dual balun of the present invention provides a solution to this dilemma.

Figure 4:
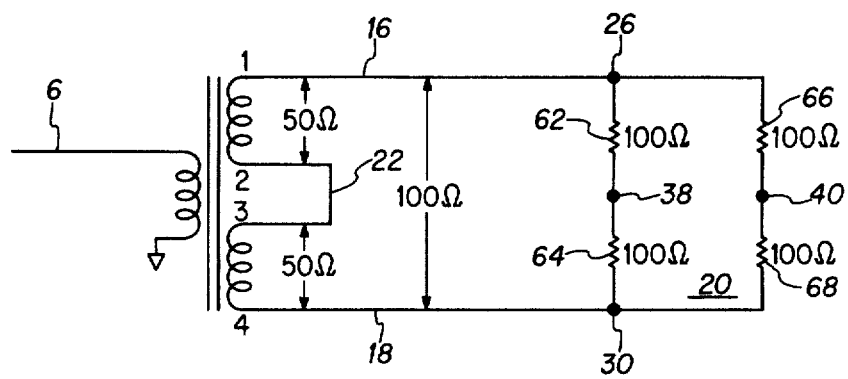
FIG. 4 is a schematic circuit diagram of the equivalent transformer circuit for the RF input port to the mixer bridge of FIG. 2.

FIG. 4 shows the equivalent schematic transformer circuitry for the balanced RF input port to diode mixer bridge 20. Primary conductor 6 induces RF signals into the dual balun provided by conductors 1, 2, 3 and 4. The coupled signal across the first balun between conductors 1 and 2 sees an impedance of 50 ohms. The coupled signal across the second balun between conductors 3 and 4 also sees an effective impedance of 50 ohms. These 50 ohm impedances are in series as schematically shown by connecting link 22, FIGS. 1 and 4, and hence there is an effective impedance of 100 ohms between conductors 16 and 18. The signal from conductor 16 is applied at point 26 and may take either of two parallel paths to its reference point 30 to which it is balanced. One path is through diodes 62 and 64, and the other path is through diodes 66 and 68. For quad 20 in FIG. 3, 100 ohm diodes are used, and the representative impedance of each is shown in FIG. 4. Each circuit branch thus has an impedance of 200 ohms, due to the series connection of two 100 ohm impedances. The total impedance across a pair of parallel 200 ohm impedances is 100 ohms, which matches the 100 ohm impedance between conductors 16 and 18, i.e., there is an equivalent impedance of 100 ohms between points 26 and 30 which matches the impedance between conductors 16 and 18.

The balanced RF input to the mixer 20 thus sees 100 ohms, whereby a wider gap 17 may be employed providing such 100 ohm impedance between conductors 16 and 18, rather than a narrow gap 17 affording a 50 ohm impedance between conductors 16 and 18. Primary conductor 6 has an impedance of 50 ohms and the dual balun provided by conductors 1, 2, 3 and 4 affords the appropriate conversion match between the 50 ohm conductor 6 and the 100 ohm impedance between balanced conductors 16 and 18.

Figure 5:
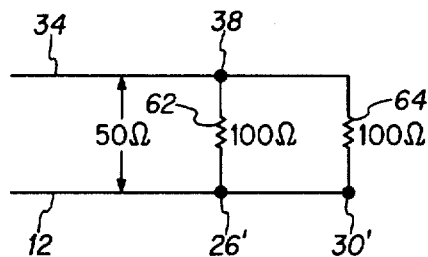
FIG. 5 is a schematic circuit diagram of the equivalent circuit for the LO port of the mixer bridge of FIG. 2.

FIG. 5 shows the equivalent schematic circuit for one of the unbalanced ports to the mixer bridge 20. The mixer has two unbalanced ports, one provided by unbalanced LO/IF conductor 34, and the other provided by unbalanced LO/IF conductor 36. FIG. 5 shows the electrical circuit equivalent for the port provided by conductor 34.

Conductor 34 is unbalanced and referenced to ground plane 12, and has a 50 ohm impedance. The signal from conductor 34 is delivered to point 38 and then through either of parallel diodes 62 and 64 to ground plane 12. Referring to FIGS. 2 and 3, point 26 appears to be an effective ground relative to LO signals because of stub 28, and point 30 appears to be an effective ground to LO signals because of stub 32. Referring to FIGS. 3 and 5, it is thus seen that LO signals from point 38 flow through diode impedance 62 to an effective ground relative thereto due to stub 28, and LO signals from point 38 flow through diode impedance 64 to an effective ground relative thereto due to stub 32. These effective ground points are designated 26' and 30' and provide equal reference levels to the LO signals from point 38 such that diodes 62 and 64 are in parallel relative to point 38, and provide an effective ground return to ground plane 12.

Diodes 62 and 64 each have an impedance of 100 ohms and thus the parallel combination thereof has an effective total impedance of 50 ohms, which matches the 50 ohm impedance of conductor 34. The other port to mixer bridge 20 provided by conductor 36 likewise has an effective impedance of 50 ohms.

As seen in FIG. 2, the RF input port to mixer bridge 20 is balanced and each of the LO input ports are unbalanced. Image current circulates in the diode quad only, to return the image frequency power to the diodes, and thus reduce conversion loss. RF conductor point 26 provides a single common connection point for diodes 62 and 66, and RF conductor point 30 provides a single common connection point for diodes 64 and 68. This provides a precise 180° phase differential between the diode pairs for generated image frequency, and a net image voltage of zero, thus reducing conversion loss. In the absence of these single point connections between the diode pairs, there would be a finite traversal distance for the image current on one or more of the microstrip conductors and this would cause a phase shift such that the image frequency phase in diode pair 62 and 64 would be other than 180° out of phase with the image frequency phase in diode pair 66 and 68. This would reduce the conversion efficiency because of uncancelled image frequency power.

The circuit layout of FIG. 2 provides mutual isolation between the RF, LO and IF signals. The LO signal on conductor 34 is isolated from conductor 36 because of the effective ground provided by points 26 and 30. One LO signal path from point 38 of conductor 34 to point 40 of conductor 36 is through diodes 62 and 66. However, the junction point therebetween is the effective ground point 26 and hence the LO signal may flow from conductor point 38 through diode 62 but is isolated from conductor point 40. The other LO signal path from conductor point 38 to conductor point 40 is through diodes 64 and 68, but the junction point therebetween is the effective ground point 30. LO signals from point 40 are likewise isolated from point 38.

The RF signal on balanced junction points 26 and 30 due to the induced RF field therebetween is isolated from conductors 34 and 36. The RF signal from junction point 26 flows through diode 62 and then diode 64 to junction point 30. Since RF conductor points 26 and 30 are balanced, they are each other's reference points, and hence the voltage on junction point 26 is referenced to junction point 30, not to ground. The RF signal from junction point 26 flows through diode 62 toward point 38 and then away from point 38 through diode 64. Connection point 38 thus sees opposite polarities (voltages which are 180° out of phase), and hence no new or additional net voltage is induced on connection point 38 from the RF signal between connection points 26 and 30. The RF signal between junction points 26 and 30 is likewise isolated from conductor 36 and its connection point 40.

The LO signals on conductors 34 and 36 are isolated from the RF signal between RF connection points 24 and 26. The LO signal on conductor point 38 sees an effective ground at each of points 26 and 30, whereby to add the same effective voltage to each in parallel, resulting in no change of the net voltage difference between points 26 and 30. The LO signal on connection point 40 is likewise isolated from the RF signal between points 26 and 30.

In FIG. 2, conductors 1, 2, 3, 4, 16, 18, IF rejection baluns 42 and 44, and ground plane 12 are all coplanar on the topside of substrate 8. Conductors 6, 34, 36, 46, 48, coupler 50, conductor 52, and IF bandpass filters 56 and 58 are all coplanar on the bottom side of substrate 8. Alternate embodiments include a first ground plane portion on the top of the substrate and a second ground plane portion on the bottom of the substrate, with conductors 1, 2, 3, 4, 16, 18, 34, 36, 46, 48, coupler 50, conductor 52, and filters 56 and 58 on top of the substrate, and conductor 6 and IF rejection filters 42 and 44 on the bottom of the substrate. In another alternative, branch line coupler 50 and one of the IF rejection baluns 42 or 44 is eliminated, and a Lange type interdigitated directional 90° coupler is used. These and other various modifications and alternatives may be like those shown in Application Ser. No. 216,872, now U.S. Pat. No. 4,330,868. It is a particularly advantageous aspect of the present invention that it is amenable to a universal type application in microwave diode mixers having a balanced port.

Figure 6:
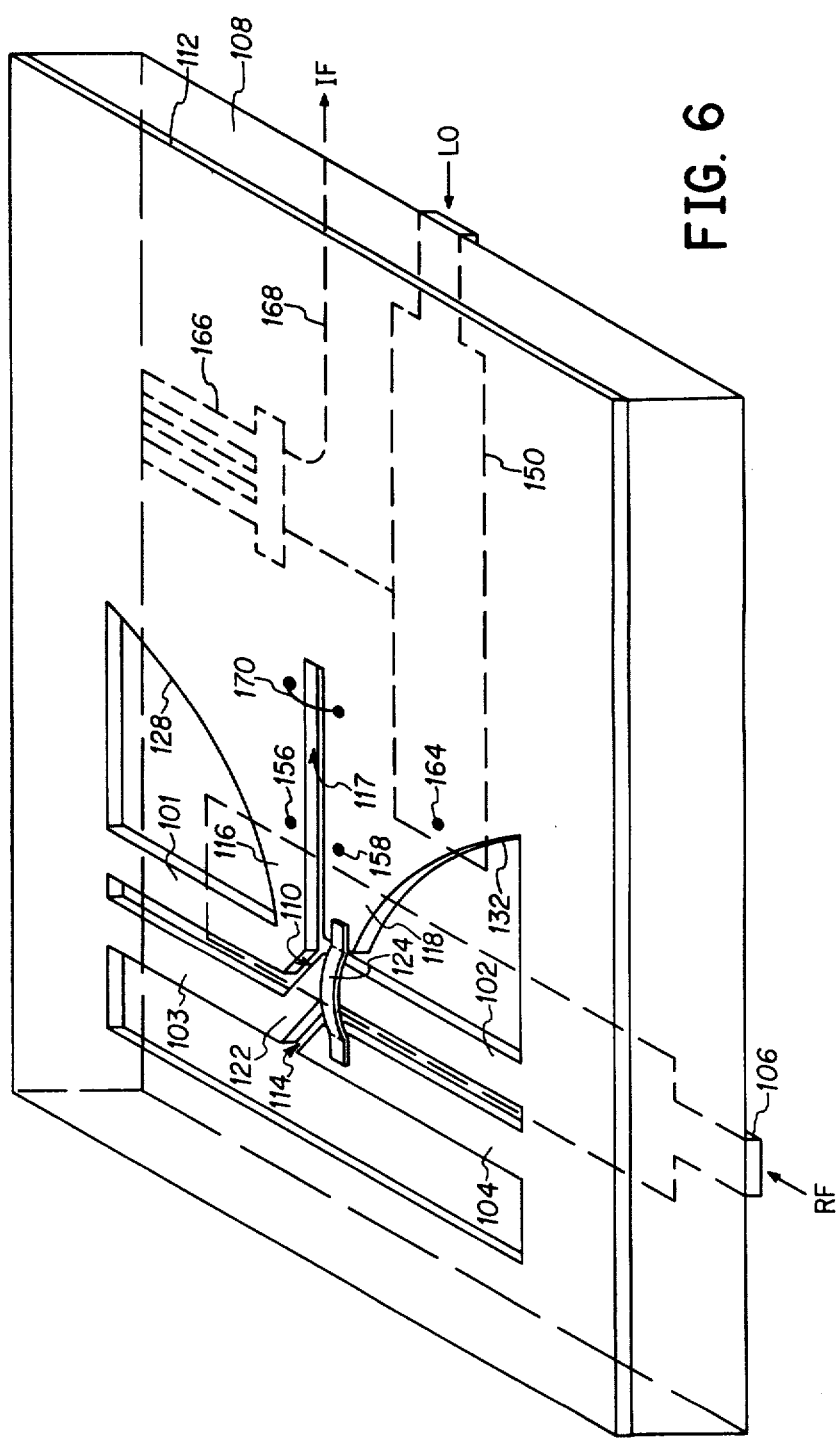
FIG. 6 is a pictorial illustration of an alternate embodiment of the invention.

FIG. 6 shows a frequency converter constructed in accordance with the invention wherein a diode mixer bridge is used. The dual balun is provided by conductors 101, 102, 103 and 104. Primary conductor 106 is on the bottom of a dielectric substrate 108 and is juxtaposed below secondary conductors 101, 102, 103 and 104.

Balanced collinear secondary conductors 101 and 102 extend toward each other and are separated by a gap 110. These conductors extend from a ground plane 112 on top of the substrate. Conductors 103 and 104 extend toward each other and are separated by a gap 114. Conductors 103 and 102 are integrally connected by a diagonal portion 122 therebetween.

Conductor 116 extends rightwardly from conductor 101 and is flared at 128 to ground plane 112. Conductor 104 is connected by jumper 124, like jumper 24 of FIG. 2, to conductor 118 which is flared at 132 to ground plane 112.

Comparably to FIG. 2, for down conversion, the RF signal on primary conductor 106 is coupled into the dual balun provided by secondary conductors 101, 102, 103 and 104, with an induced RF signal existing between conductors 101 and 102, and an induced RF signal existing between conductors 103 and 104. The field between each of these two secondary pairs of conductors contributes to the field between balanced conductors 116 and 118 across gap 117.

An unbalanced LO/IF conductor 150 is on the bottom of the substrate and extends below in spaced parallel juxtaposed relation with gap 117 in the top ground plane 112. Conductor 150 carries LO signals and is unbalanced, i.e., the field around conductor 150 is referenced to ground at ground plane 112.

Figure 7:
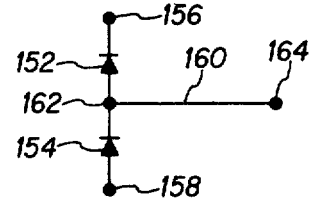
FIG. 7 shows the diode bridge connection for FIG. 6.

Referring to FIGS. 6 and 7, a pair of diodes 152 and 154 is connected in series between point 156 on conductor 116 and point 158 on conductor 118. A conductive lead 160 extends from a point 162 between the diodes down through substrate 108 to point 164 near the end of conductor 150.

When the converter of FIG. 6 is implemented as a down converter, an RF signal is input on conductor 106 and an LO signal is input on conductor 150. The diode pair mixer bridge has a balanced port provided by balanced conductors 116 and 118, and an unbalanced port provided by conductor 150. The diode pair mixes the RF signal from its balanced port with the LO signal from its unbalanced port to generate an IF signal. An IF bandpass filter 166, like that shown in my above noted U.S. Pat. No. 3,678,433, is on the bottom surface of substrate 112 and is connected to conductor 150.

When the converter of FIG. 6 is implemented as an up converter, the diode pair mixes an input LO signal on conductor 150 with an input IF signal on conductor 150 from lead 168. This results in heterodyne modulation product signal generation by the diode pair mixer, including an RF signal on conductors 116 and 118 and hence an induced output RF signal on conductor 106.

In the converter of FIG. 6, there is isolation between the RF signal on conductors 116 and 118 and the LO signal on conductor 150. The LO signal on conductor 150 is isolated from the RF signal between conductors 116 and 118 because of the effective ground provided by connection points 156 and 158. The LO signal on conductor 150 sees an effective ground at each of points 156 and 158, whereby to add the same effective voltage to each in parallel, resulting in no change of the net voltage difference between points 156 and 158. Connection points 156 and 158 are at substantially the same reference level relative to LO signals on conductor 150 such that no new or additional net potential is induced between conductors 116 and 118 from conductor 150, i.e., conductor 150 sees the same potential drop to each of conductors 116 and 118 and thus does not induce any new or additional net potential therebetween. A conductive jumper strap 170 may be provided across gap 117 between conductors 116 and 118 to further insure that two sides of gap 117 are at substantially the same reference level relative to LO signals on conductor 150.

The RF signal on balanced connection points 156 and 158 due to the induced field therebetween from conductor 106 is isolated from conductor 150. The RF signal from connection point 158 flows through diode 154 and then through diode 152 to connection point 156. Since RF conductor points 158 and 156 are balanced, they are each other's reference points and hence the voltage on connection point 158 is referenced to connection point 156. The RF signal from connection point 158 flows through diode 154 towards point 162, and then away from point 162 through diode 152, such that point 162 sees opposite polarities (voltages which are 180° out of phase), and hence no new or additional net voltage is induced on point 164 of conductor 150 by the RF signal between conductors 116 and 118.

In an alternative to the embodiment of FIG. 6, conductor 150, filter 166, conductors 116, 118, 101, 102, 103, 104, and a first ground plane portion are all coplanar on the top of the substrate. Conductor 106 and a second ground plane portion are on the bottom of the substrate. Various other modifications and alternatives may be like those shown in my U.S. Pat. No. 4,330,868. A desirable aspect of the present invention is its applicability to both a diode quad type mixer and a diode pair type mixer, FIGS. 2 and 6.

Figure 8:
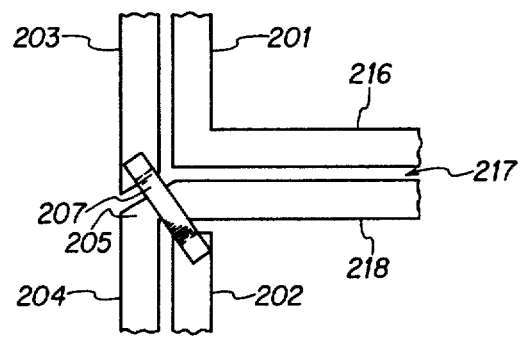
FIG. 8 is an isolated view of an alternative dual balun structure.

FIG. 8 shows another embodiment of the dual balun structure of FIGS. 1 and 6. The dual balun in FIG. 8 is provided by conductors 201, 202, 203, and 204, corresponding respectively to conductors 1, 2, 3, and 4 of FIG. 1, and respectively to conductors 101, 102, 103 and 104 of FIG. 6. A primary conductor (not shown), like conductor 6 in FIG. 1 or conductor 106 in FIG. 6, is juxtaposed below secondary conductors 201, 202, 203, and 204. The signal on the primary conductor is coupled into the first pair of secondary conductors 201 and 202, and is coupled into the second pair of secondary conductors 203 and 204. The field between each of these first and second secondary pairs of conductors contributes to the field between balanced conductors 216 and 218 across gap 217, corresponding respectively to conductors 16 and 18 in FIG. 1, and respectively to conductors 116 and 118 in FIG. 6. Conductors 204 and 218 are integrally connected by a diagonal portion 205 therebetween and coplanar therewith. Conductors 202 and 203 are connected by a jumper 207 over and separated from diagonal portion 205. The dual balun is thus provided by first secondary pair 201 and 202, and second secondary pair 203 and 204.

It is recognized that various modifications are possible within the scope of the appended claims.

I claim:

1. A frequency converter comprising, in combination:

a mixer for heterodyne modulation produce signal generation;

a dual balun, including output means, said dual balun comprising two pairs of balanced secondary conductors juxtaposed a common primary conductor, an electrical field being generated by each secondary conductor pair and appearing at said output means, one of said pairs of secondary conductors comprising first and second secondary conductors collinearly extending toward each other, the other of said pairs of secondary conductors comprising third and fourth secondary conductors collinearly extending toward each other, said first and third secondary conductors extending in spaced parallel relation, said second and fourth secondary conductors extending in spaced parallel relation, and wherein said output means is connected to said first and fourth secondary conductors;

means ohmically connecting said second and third secondary conductors to maintain same at the same potential, the field between said first and second secondary conductors contributing half of the field appearing at said output means of said dual balun, and the field between said third and fourth secondary conductors contributing the other half of the field appearing at said output means of said dual balun; and a pair of balanced conductors leading to said mixer from said output means of said dual balun.

2. A frequency converter comprising, in combination:

a mixer for heterodyne modulation product signal generation;

a dual balun, including a plurality of output means, said dual balun comprising two pairs of balanced secondary conductors juxtaposed a common primary conductor, an electrical field being generated by each secondary conductor pair and appearing at said output means, one of said pairs of secondary conductors comprising first and second secondary conductors collinearly extending toward each other, the other of said pairs of secondary conductors comprising third and fourth secondary conductors collinearly extending toward each other, said first and third secondary conductors extending in spaced parallel relation, said second and fourth secondary conductors extending in spaced parallel relation, and wherein said plurality of output means is connected to said first and fourth secondary conductors;

diagonal means connecting said second and third secondary conductors via a conductive path extending diagonally between proximate ends of said second and third secondary conductors;

electrically conductive jumper means extending from said fourth secondary conductor, over said diagonal means, to one of said plurality of means of said dual balun; and a pair of balanced conductors leading to said mixer from said plurality of output means of said dual balun.

3. A frequency converter comprising, in combination:

a mixer for heterodyne modulation product signal generation;

a dual balun, including a plurality of output means, said dual balun comprising two pairs of balanced secondary conductors juxtaposed a common primary conductor, an electrical field being generated by each secondary conductor pair and appearing at said output means, one of said pairs of secondary conductors comprising first and second secondary conductors collinearly extending toward each other, the other of said pairs of secondary conductors comprising third and fourth secondary conductors collinearly extending toward each other, said first and third secondary conductors extending in spaced parallel relation, said second and fourth secondary conductors extending in spaced parallel relation, and wherein said plurality of output means is connected to said first and fourth secondary conductor;

diagonal means connecting said fourth conductor to one of said plurality of output means of said dual balun via a conductive path extending diagonally between proximate ends of said secondary conductors;

electrically conductive jumper means extending from said third to said second secondary conductor; and a pair of balanced conductors leading to said mixer from said plurality of output means said dual balun.

4. A frequency converter comprising, in combination:

a mixer for heterodyne modulation product signal generation;

a dual balun comprising two pairs of balanced secondary conductors juxtaposed a common primary conductor and forming two baluns;

means electrically connecting one end of a conductor of each of said pairs of balanced secondary conductors of said dual balun whereby the two baluns are electrically connected in series to form additive output impedances;

output means for said dual balun comprising electrical connections to an end of another conductor of each of said pairs of balanced secondary conductors of said dual balun; and a pair of balanced conductors leading to said mixer from said output means of said dual balun.

* * * * *